United States Patent
Ono et al.

(10) Patent No.: US 10,219,416 B2
(45) Date of Patent: Feb. 26, 2019

(54) ELECTRIC POWER CONVERSION APPARATUS AND ELECTRIC POWER CONVERSION SYSTEM

(71) Applicant: KABUSHIKI KAISHA YASKAWA DENKI, Kitakyushu-shi (JP)

(72) Inventors: Fumiya Ono, Fukuoka (JP); Sumiaki Nagano, Fukuoka (JP)

(73) Assignee: KABUSHIKI KAISHA YASKAWA DENKI, Kitakyushu-shi (JP)

(*) Notice: Subject to any disclaimer, the term of this patent is extended or adjusted under 35 U.S.C. 154(b) by 199 days.

(21) Appl. No.: 15/221,778

(22) Filed: Jul. 28, 2016

(65) Prior Publication Data
US 2017/0303444 A1   Oct. 19, 2017

(30) Foreign Application Priority Data
Apr. 19, 2016   (JP) .................. 2016-083930

(51) Int. Cl.
  *H05K 7/20* (2006.01)
  *H01R 9/24* (2006.01)
  *H05K 7/14* (2006.01)

(52) U.S. Cl.
  CPC ....... *H05K 7/20909* (2013.01); *H01R 9/2416* (2013.01); *H05K 7/1432* (2013.01)

(58) Field of Classification Search
  CPC . H01R 4/34; H01R 4/30; H01R 4/363; H01R 4/36; H01R 4/24
  See application file for complete search history.

(56) References Cited

U.S. PATENT DOCUMENTS

| | | | | |
|---|---|---|---|---|
| 6,811,425 B1* | 11/2004 | Chiang | ............ | H01R 9/24 439/372 |
| 2009/0081897 A1* | 3/2009 | Waltz | ............ | H01R 4/36 439/277 |
| 2011/0294363 A1* | 12/2011 | Yeh | ............ | H01R 4/38 439/709 |
| 2012/0229958 A1* | 9/2012 | Hughes | ............ | H01H 9/04 361/673 |
| 2016/0359317 A1* | 12/2016 | Yamanaka | ............ | H02H 7/122 |

FOREIGN PATENT DOCUMENTS

| | | |
|---|---|---|
| CN | 102683958 A | 9/2012 |
| CN | 102751850 A | 10/2012 |
| CN | 204516971 U | 7/2015 |
| JP | 11-225498 | 8/1999 |

OTHER PUBLICATIONS

Combined Office Action and Search Report dated Jun. 4, 2018 in Chinese Patent Application No. 201710231106.6 with English translation, 14 pages.

* cited by examiner

*Primary Examiner* — Hoa C Nguyen
*Assistant Examiner* — Amol H Patel
(74) *Attorney, Agent, or Firm* — Oblon, McClelland, Maier & Neustadt, L.L.P.

(57) ABSTRACT

An electric power conversion apparatus comprises a terminal block for connecting a conductive member, the terminal block including: a terminal; a movable fastener that switches by movement between a first state and a second state, the first state being a state of holding the conductive member connected with the terminal, the second state being a state of releasing the conductive member; a storage unit that stores at least a part of the movable fastener in at least one of the first state and the second state; and vent holes that are provided in the storage unit.

21 Claims, 16 Drawing Sheets

Fig.1
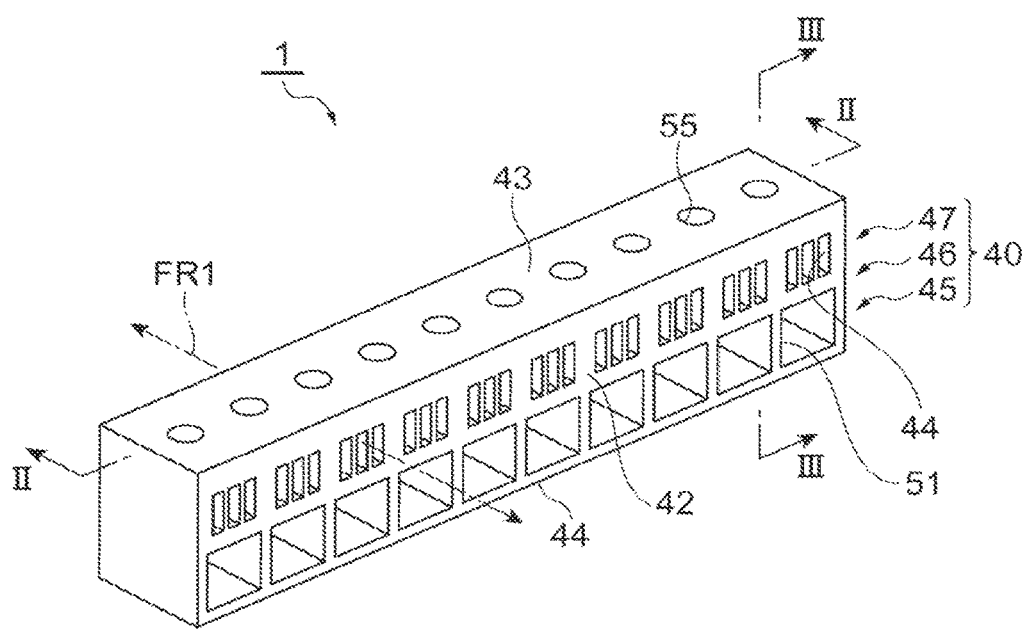
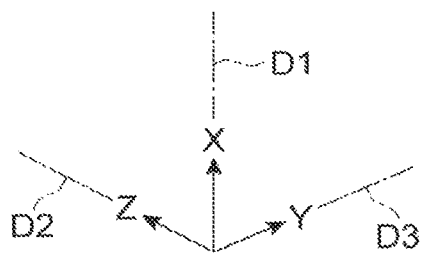

ELECTRIC POWER CONVERSION APPARATUS AND ELECTRIC POWER CONVERSION SYSTEM

CROSS-REFERENCE TO RELATED APPLICATION

This application is based upon and claims the benefit of priority from Japanese Patent Application No. 2016-083930, filed on Apr. 19, 2016, the entire contents of which are incorporated herein by reference.

BACKGROUND

1. Field

The disclosure relates to an electric power conversion apparatus and an electric power conversion system.

2. Description of the Related Art

In Japanese Unexamined Patent Publication No. H11-225498, an inverter apparatus that is installed in a pump control board is disclosed.

SUMMARY

An electric power conversion apparatus according to the disclosure comprises a terminal block for connecting a conductive member, the terminal block including: a terminal; a movable fastener that switches by movement between a first state and a second state, the first state being a state of holding the conductive member connected with the terminal, the second state being a state of releasing the conductive member; a storage unit that stores at least a part of the movable fastener in at least one of the first state and the second state; and a vent hole that is provided in the storage unit.

An electric power conversion system according to the disclosure comprises an electric power conversion apparatus, the electric power conversion apparatus including: a circuit element for electric power conversion; and a terminal block for connecting a conductive member, the terminal block being arranged with the circuit element along a vertical direction, the terminal block including: a terminal; a movable fastener that switches by movement between a first state and a second state, the first state being a state of holding the conductive member connected with the terminal, the second state being a state of releasing the conductive member; a storage unit that stores at least a part of the movable fastener in at least one of the first state and the second state; and a vent hole that is provided in the storage unit.

BRIEF DESCRIPTION OF THE DRAWINGS

FIG. 1 is a perspective view of a terminal block;

DETAILED DESCRIPTION

Figure 2:
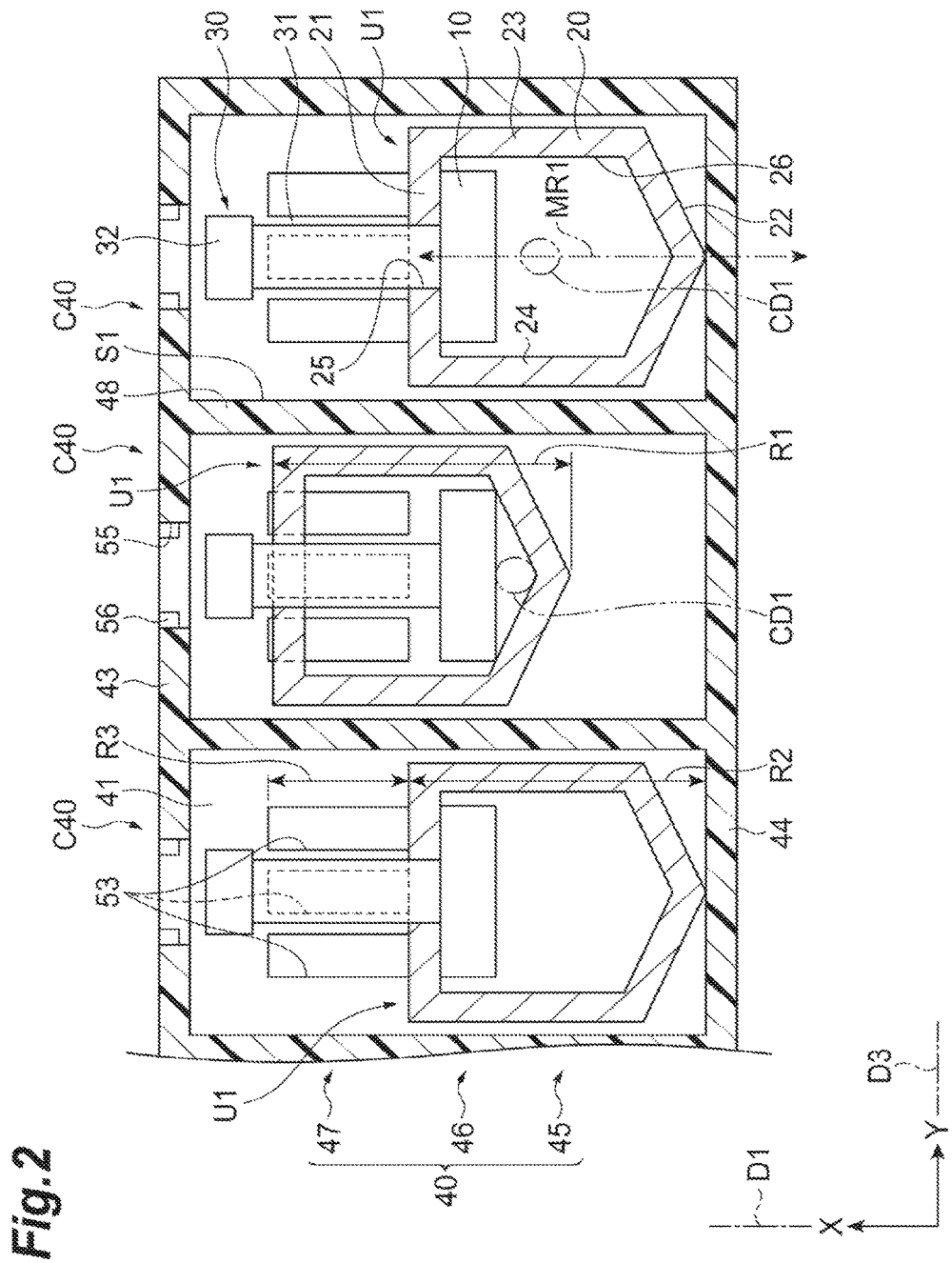
FIG. 2 is a cross-section view taken along line II-II in FIG. 1.

Hereinafter, an embodiment will be described in detail, with reference to the drawings. In the description, identical reference characters are assigned to identical elements or elements having identical functions, and repetitive descriptions are omitted.

1. Terminal Block

First, a terminal block according to the embodiment will be described. The terminal block includes at least one terminal for connecting a conductive member, and for example, can be used as a constituent element of an input/output port of an electric machine. The terminal block according to the embodiment includes, at least, a terminal, a movable fastener, a storage unit, and a vent hole. The movable fastener, by movement, switches between a first state of holding the conductive member connected with the terminal and a second state of releasing the conductive member. The storage unit stores at least a part of the movable fastener, in at least one of the first state and the second state. The vent hole is provided in the storage unit.

(1) Specific Configuration Example of Terminal Block

In the following, a specific configuration example of a terminal block 1 according to the embodiment will be shown with reference to FIGS. 1 to 3. The terminal block 1 includes a terminal 10, a movable fastener 20, a screw 30, and a case 40. In the description of the arrangement relation of the elements, a first direction D1, a second direction D2 crossing (for example, orthogonal to) the first direction D1, and a third direction D3 crossing (for example, orthogonal to) the first direction D1 and the second direction D2 are used. In each figure, the direction along the X-axis is the first direction D1, the direction along the Z-axis is the second direction D2, and the direction along the Y-axis is the third direction D3.

The terminal 10 is, for example, an element for connecting a conductive member CD1 such as a core wire of an electric cable, and is composed of a conductive material such as metal. As an example, the terminal 10 is a plate-like body crossing (for example, orthogonal to) the first direction D1, and extends along the second direction D2.

The movable fastener 20, by movement, switches between the first state of holding the conductive member CD1 connected with the terminal 10 and the second state of releasing the conductive member CD1. A movement route MR1 of the movable fastener 20 is along the first direction D1. The movable fastener 20 may be composed of a conductive material such as metal.

As an example, the movable fastener 20 includes a first part 21, a second part 22, a third part 23 and a fourth part 24. The first part 21 faces the terminal 10 from one side in the first direction D1 (for example, from the positive side of the X-axis), and the second part 22 faces the terminal 10 from the opposite side to the first part 21. The first part 21 includes a pierced female screw hole 25 for screwing in a screw 30 described later. The third part 23 faces the terminal 10 from one side in the third direction D3 (for example, from the positive side of the Y-axis), and both edge parts thereof are connected with the first part 21 and the second part 22, respectively. The fourth part 24 faces the terminal 10 from the opposite side to the third part 23, and both edge parts thereof are connected with the first part 21 and the second part 22, respectively.

By the above connection relation, the first part 21, the second part 22, the third part 23 and the fourth part 24 constitute a circular body that surrounds the terminal 10. In other word, the movable fastener 20 includes an opening 26, in a region surrounded by the first part 21, the second part 22, the third part 23 and the fourth part 24.

The screw 30 moves the movable fastener 20 along the movement route MR1. The screw 30 is, for example, a bolt, and includes a thread part 31 and a head part 32. The thread part 31 is screwed in the female screw hole 25, from the opposite side to the terminal 10. The screw 30 is a means for switching by movement of the movable fastener 20 between the first state and the second state.

According to such a configuration, it is possible to move the movable fastener 20, by rotating the screw 30 in a state in which the tip end part (the end part on the opposite side to the head part 32) of the thread part 31 contacts with the terminal 10. For example, in the case of rotating the screw 30 in the tightening direction, a part of the thread part 31 that is positioned between the terminal 10 and the first part 21 becomes longer. Consequently, the first part 21 is separated from the terminal 10, and by that amount, the movable fastener 20 moves to one side in the first direction D1 (for example, to the positive side of the X-axis). When the first part 21 gets away from the terminal 10, the second part 22 comes close to the terminal 10. On the other hand, in the case of rotating the screw 30 in the loosening direction, the part of the thread part 31 that is positioned between the terminal 10 and the first part 21 becomes shorter. Consequently, the first part 21 comes close to the terminal 10, and by that amount, the movable fastener 20 moves to the other side 1n the first direction D1 (for example, to the negative side of the X-axis).

By the movement corresponding to the rotation of the screw 30, the movable fastener 20 switches between the above first state and second state. For example, the movable fastener 20 switches between the above first state and second state, in a state in which the conductive member CD1 is disposed between the terminal 10 and the second part 22.

In a state in which there is a gap (a gap in the first direction D1) between at least one of the terminal 10 and the second part 22 and the conductive member CD1, the conductive member CD1 is not held connected with the terminal 10. That is, the connection state of the conductive member CD1 with the terminal 10 is the above second state. Thus, in the configuration, the state in which there is a gap in the first direction D1 between at least one of the terminal 10 and the movable fastener 20 and the conductive member CD1 corresponds to the above second state.

As described above, when the movable fastener 20 moves to the positive side of the X-axis, the second part 22 comes close to the terminal 10. When the second part 22 comes close to the terminal 10 until the conductive member CD1 comes into contact with both of the terminal 10 and the second part 22, the conductive member CD1 is held connected with the terminal 10. That is, the connection state of the conductive member CD1 with the terminal 10 switches from the above second state to the above first state. Thus, in the configuration, the state in which the conductive member CD1 contacts with both of the terminal 10 and the movable fastener 20 corresponds to the above first state.

In this state, at least a part of the opening 26 of the movable fastener 20 is positioned inside a storage unit 47, and communicates with vent holes 53, 54. In the first state, when the movable fastener 20 moves to the negative side of the X-axis as described above, the second part 22 moves farther from the terminal 10, and the conductive member CD1 sandwiched between the second part 22 and the terminal 10 is released. That is, the connection state of the conductive member CD1 with the terminal 10 switches from the above first state to the above second state.

The case 40 stores the terminal 10, the movable fastener 20 and the screw 30 (hereinafter, one set of them is referred to as a "terminal unit U1"). The case 40 may be composed of an insulating material such as resin.

As an example, the case 40 includes outer walls 41, 42 that face each other in the second direction D2, and outer walls 43, 44 that face each other in the first direction D1. The outer wall 43 connects the outer walls 41, 42 on the one side in the first direction D1 (on the positive side of the X-axis), and the outer wall 44 connects the outer walls 41, 42 on the other side in the first direction D1 (on the negative side of the X-axis).

The case 40 configured in this way includes an inlet unit 45, a terminal holding unit 46 and the storage unit 47. The inlet unit 45, the terminal holding unit 46 and the storage unit 47 are arranged along the first direction D1 in the order from the above other side (from the negative side of the X-axis) to the above one side (to the positive side of the X-axis). The terminal holding unit 46 positioned between the inlet unit 45 and the storage unit 47 holds the terminal 10. More specifically, in the terminal holding unit 46, the outer wall 41 holds one end part of the terminal 10, and the outer wall 42 holds the other end part of the terminal 10. The above one end part of the terminal 10 pierces through the outer wall on the opposite side to the outer wall on which an inlet hole 51 is provided (through the outer wall 41 in illustration). Thereby, the wiring to the terminal 10 in the apparatus including the terminal block 1 is possible.

Since the terminal 10 is held in the terminal holding unit 46, the storage unit 47 is arranged on one side of the terminal 10 in the first direction D1, and the inlet unit 45 is arranged on the other side of the terminal 10 in the first direction D1. The first part 21 of the movable fastener 20 is positioned inside the storage unit 47, and the second part 22 is positioned inside the inlet unit 45.

Here, the storage unit 47 does not always need to be arranged with the terminal 10 in the first direction D1. For example, a region where the terminal 10 is provided and a region where the storage unit 47 is provided may overlap in the first direction D1. More specifically, the terminal 10 may be provided inside the storage unit 47.

The inlet unit 45 receives the conductive member CD1, between the second part 22 and the terminal 10. More specifically, in the inlet unit 45, the inlet hole 51 for receiving the conductive member CD1 is provided on at least one of the outer walls 41, 42 (on the outer wall 42 in illustration). The inlet hole 51 may be provided on both of the outer walls 41, 42.

The storage unit 47 stores at least a part of the movable fastener 20, on the opposite side to the inlet unit 45. The storage unit 47 has a storage space Si for storing the movable fastener 20, and is configured such that the storage space Si is positioned on the movement route MR1 of the movable fastener 20.

The storage unit 47 may be configured such that at least a part of the movable fastener 20 is positioned outside the storage unit 47 in the second state and is positioned inside the storage unit 47 in the first state. As an example, the storage unit 47 stores the first part 21, and a part of the third part 23 and a part of the fourth part 24. As described above, with the switching from the second state to the first state, the movable fastener 20 moves to the positive side of the X-axis. Consequently, parts that are of the third part 23 and the fourth part 24 and that are positioned outside the storage unit 47 enter the storage unit 47. That is, at least a part of the third part 23 and at least a part of the fourth part 24 are positioned outside the storage unit 47 in the second state and are positioned inside the storage unit 47 in the first state.

The case 40 further includes vent holes 53, 54 that are provided in the storage unit 47. The vent holes 53, 54 are means for constituting a vent route in the storage unit 47. The vent holes 53, 54 may pierce through the storage unit 47, along the second direction D2 crossing the movement route MR1. More specifically, in the storage unit 47, the vent hole 53 is provided on the outer wall 41, and the vent hole 54 is provided on the outer wall 42. The vent holes 53, 54 constitute a vent route FR1 that passes through the terminal block 1 along the second direction D2.

A region R3 where the vent holes 53, 54 are provided (a region that is surrounded by the circumferences of the vent holes 53, 54) and at least one of a region R1 that the movable fastener 20 occupies in the above first state and a region R2 that the movable fastener 20 occupies in the above second state may overlap with each other in the first direction D1. In other words, the range of the X-axis coordinates in the region R3 (the range of the X-axis coordinates of all points included in the region R3) and the range of the X-axis coordinates in the region R1 (the range of the X-axis coordinates of all points included in the region R1) may overlap, or the range of the X-axis coordinates in the region R3 and the range of the X-axis coordinates in the region R2 (the range of the X-axis coordinates of all points included in the region R2) may overlap. In the illustrated example, the region R1 and the region R3 overlap.

The case 40 may include a plurality of vent holes 53 and a plurality of vent holes 54 that are arranged along a direction crossing the first direction D1 (for example, along the third direction D3). The case 40 may include a plurality of vent holes 53 and a plurality of vent holes 54 that are arranged along the first direction D1. The opening areas of the vent holes 53, 54 may be smaller compared to the opening area of the inlet hole 51.

The storage unit 47 stores the screw 30, together with the first part 21. As illustrated, the whole of the screw 30 may be stored inside the storage unit 47, or a part (for example, the head part 32) of the screw 30 may be positioned outside the storage unit 47. That is, at least a part of the screw 30 is provided inside the storage unit 47.

The case 40 may further include an opening 55 for operating the screw 30. The opening 55, for example, is provided on the outer wall 43 in the storage unit 47. By inserting a tool (for example, a screwdriver) into the storage unit 47 through the opening 55, it is possible to easily perform the operation of rotating the screw 30 to move the movable fastener 20.

The terminal block 1 may include a plurality of terminal units U1. For example, the terminal block 1 may include a plurality of terminal units U1 that are arranged along the third direction D3. The case 40, by dividing walls 48, may be divided into a plurality of cells C40 that are arranged along the third direction D3, and the plurality of terminal units U1 may be stored in the plurality of cells C40, respectively. In this case, the inlet hole 51, the vent holes 53, 54 and the opening 55 are provided for each cell C40.

(2) Screw Holding Structure

The case 40 may be configured to hold the screw 30 inside the storage unit 47. For example, the inner diameter of the opening 55 may be smaller compared to the outer diameter of the head part 32 of the screw 30.

The case 40 may be configured to hold the screw 30 inside the storage unit 47 and therewith allow the screw 30 to be detached out of the storage unit 47 as necessary. In the following, an example thereof will be shown.

Figure 3:
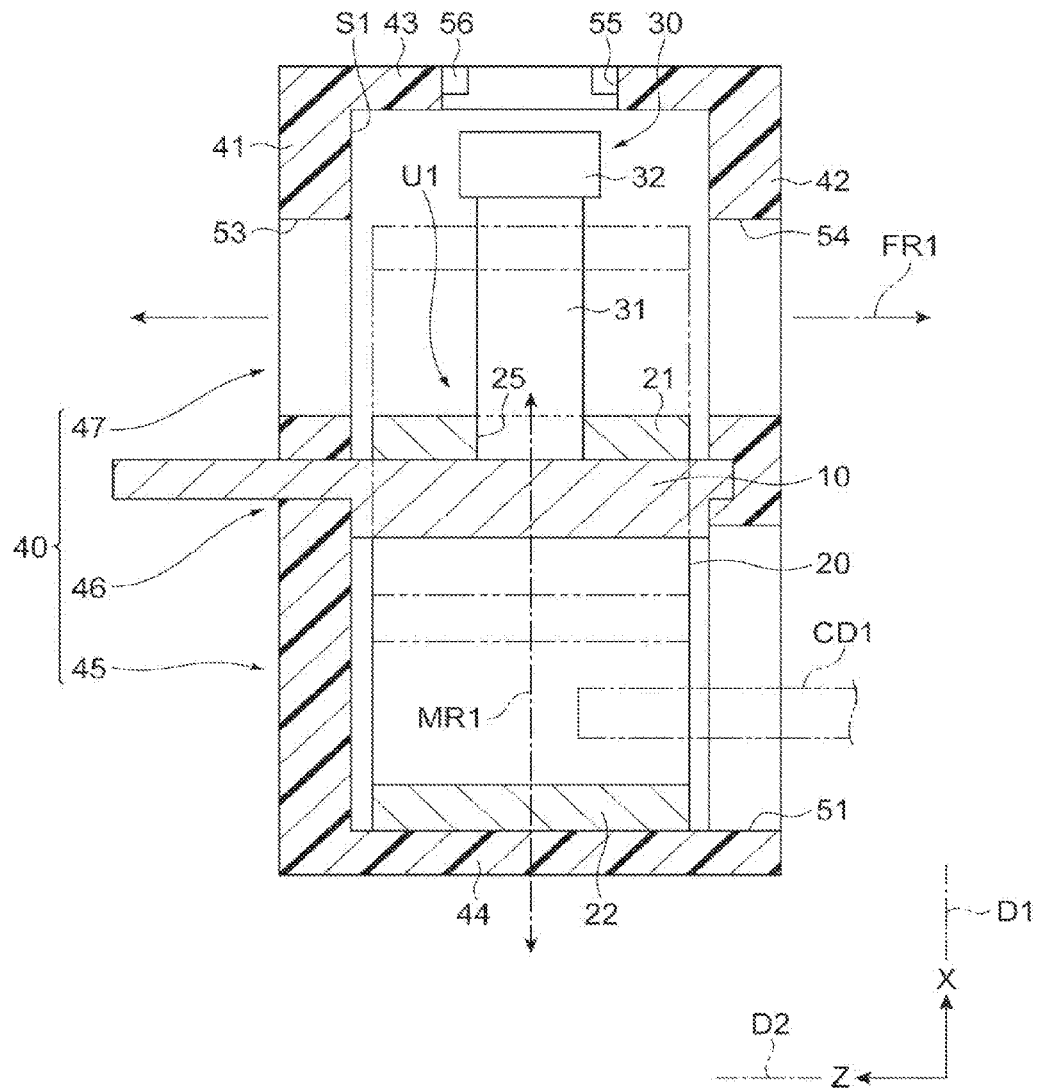
FIG. 3 is a cross-section view taken along line in FIG. 1.
Figure 4:
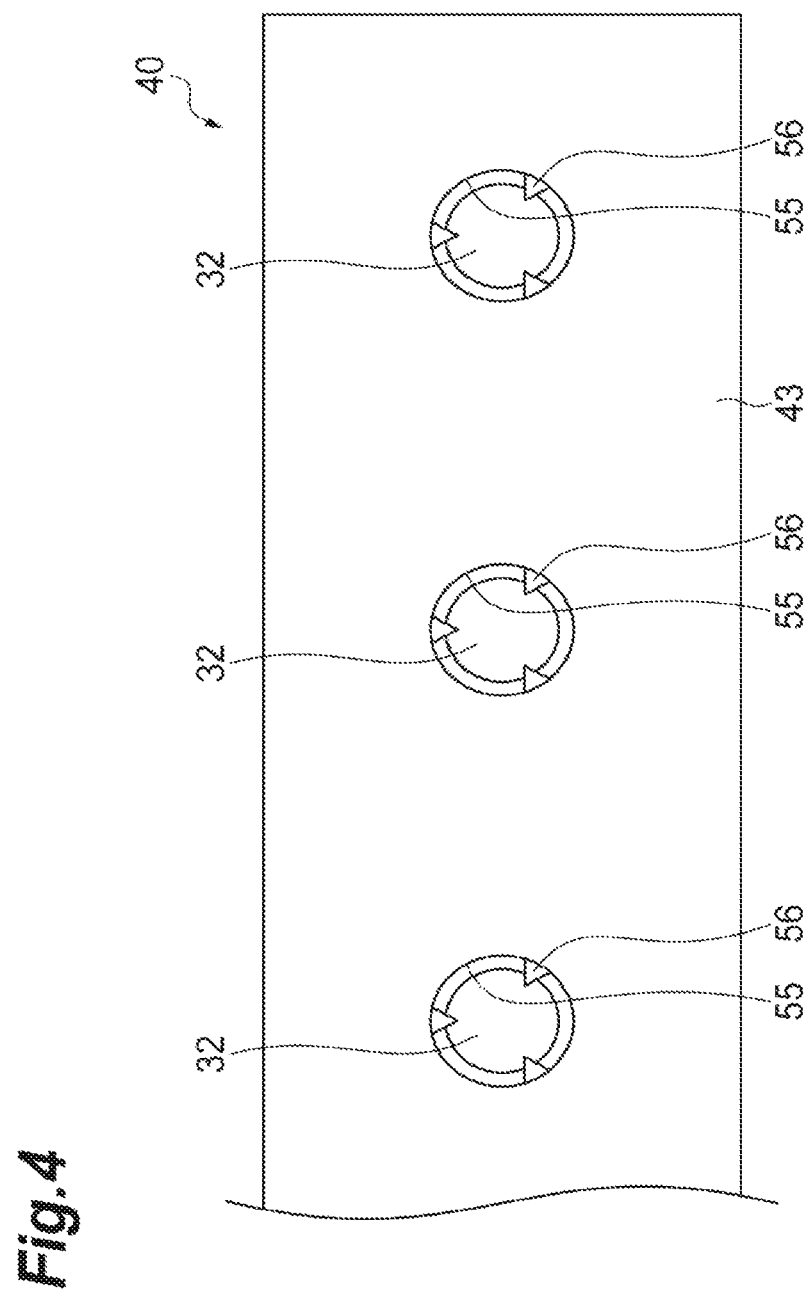
FIG. 4 is a plan view of the terminal block.

As shown in FIGS. 2 to 4, the inner diameter of the opening 55 is larger compared to the outer diameter of the head part 32 of the screw 30. The case 40 includes at least one protrusion 56 in the opening 55. The protrusion 56 protrudes from the circumference of the opening 55 to the center side of the opening 55. The protrusion length of the protrusion 56 is set such that the head part 32 cannot pass through the inside of the opening 55. Thereby, the screw 30 is held inside the storage unit 47 by the protrusion 56. The case 40 may include a plurality of protrusions 56 inside the opening 55. The plurality of protrusions 56 are arranged in such a way as to encompass the center of the opening 55.

The protrusion 56 is configured in such a way as not to be broken by the screw 30 in a state in which the first part 21 contacts with the terminal 10. For example, the protrusion 56 is disposed such that the force to act on the protrusion 56 from the head part 32 does not reach a level for breaking the protrusion 56 even when the screw 30 is maximally rotated in the loosening direction in the state in which the first part 21 contacts with the terminal 10. The load to act on the protrusion 56 from the head part 32 can be regulated, for example, by the relation between the distance from the terminal 10 to the protrusion 56 and the length of the screw 30. Here, the "breaking" means putting the protrusion 56 into a state of being unable to hold the screw 30 inside the storage unit 47. Specific examples of the breaking include deforming or damaging the protrusion 56 into the state of being unable to hold the screw 30 inside the storage unit 47.

The protrusion 56 is configured to be breakable by the screw 30 in a state in which at least the first part 21 maximally has got away from the terminal 10 (in a state in which the second part 22 maximally has come close to the terminal 10). For example, the interval between the protrusion 56 and the terminal 10 is equal to or greater than the total of the whole length of the screw 30, the thickness of the first part 21, and the maximum of the interval between the first part 21 and the terminal 10. Therefore, by rotating the screw 30 in the loosening direction in the state in which at least the first part 21 maximally has got away from the terminal 10, it is possible to make the head part 32 of the screw 30 reach the protrusion 56, and to break the protrusion 56 by the head part 32.

Figure 5:
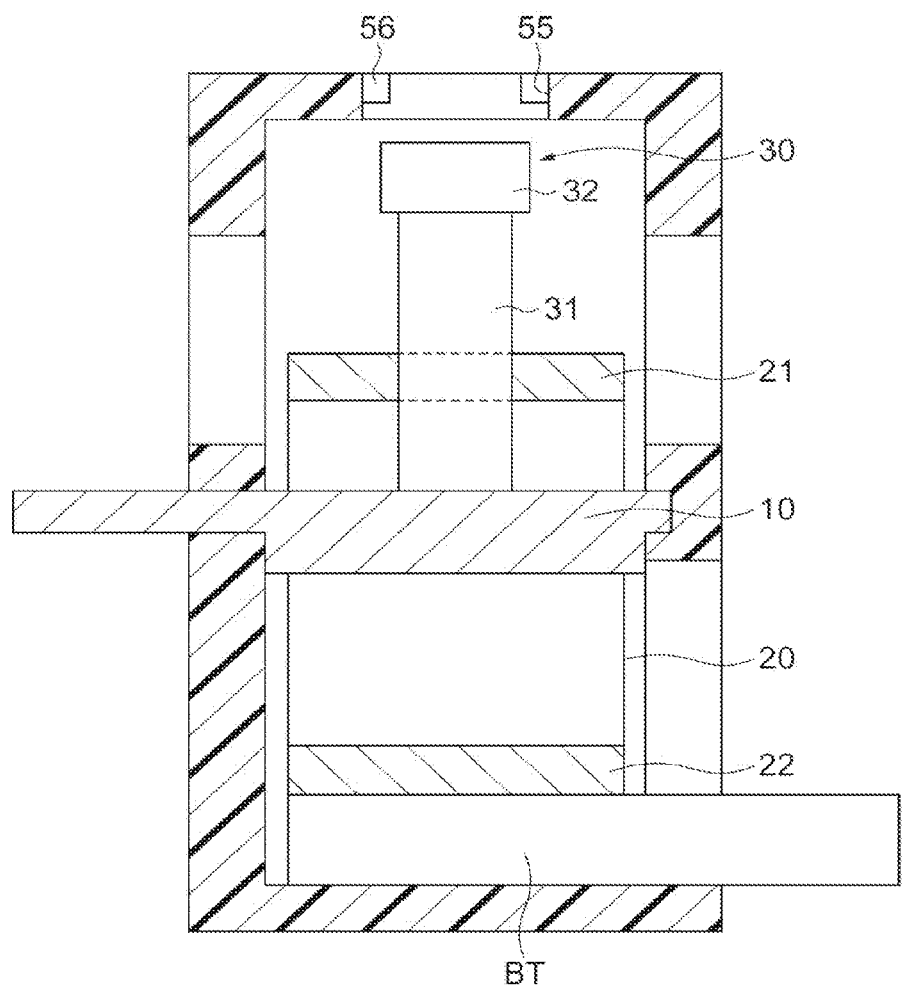
FIG. 5 is a diagram showing a detaching procedure for a screw.
Figure 6:
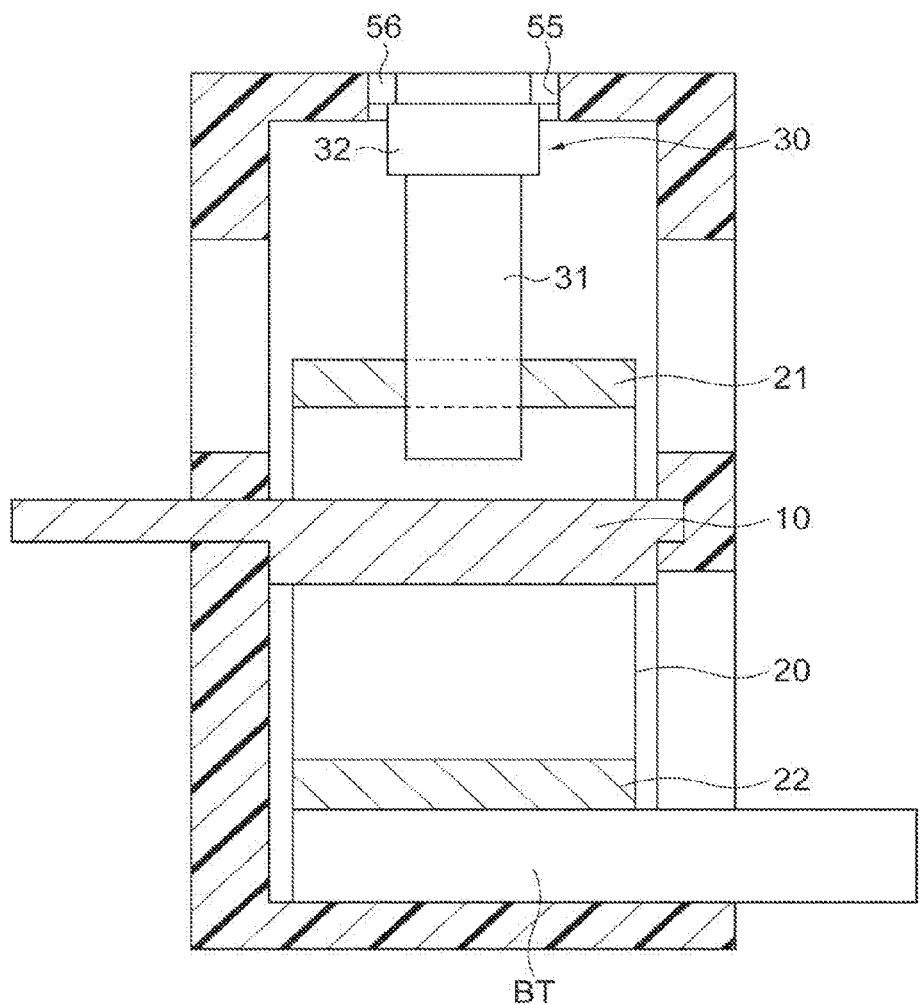
FIG. 6 is a diagram showing the detaching procedure for the screw.
Figure 7:
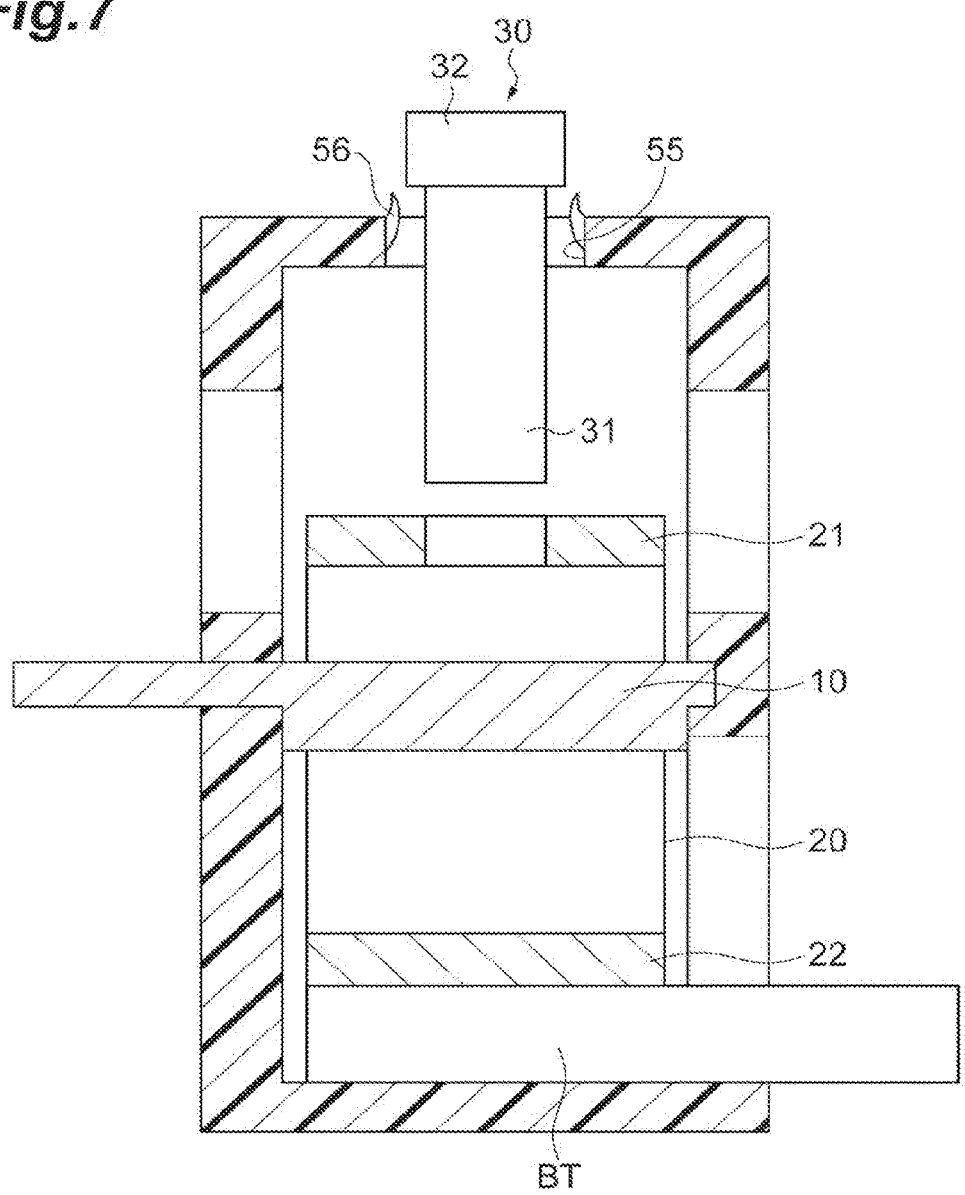
FIG. 7 is a diagram showing the detaching procedure for the screw.

According to such a configuration, it is possible to detach the screw 30 out of the storage unit 47 in the following procedure. First, as shown in FIG. 5, a restriction member BT (for example, the tip end part of a screwdriver) is inserted between the movable fastener 20 and the outer wall 44, and thereby, the movable fastener 20 is kept away from the outer wall 44. Thereby, the first part 21 is kept away from the terminal 10. In this state, as shown in FIG. 6, the screw 30 is rotated in the loosening direction, and the head part 32 is made to reach the protrusion 56. Furthermore, as shown in FIG. 7, the protrusion 56 is broken by continuing the rotation of the screw 30 in the loosening direction. Thereby, the detaching of the screw 30 out of the storage unit 47 is possible. Unless such an operation is performed, it is not possible to sufficiently generate the load on the protrusion 56 by the screw 30, and therefore, the screw 30 is surely held inside the storage unit 47.

(3) Modification of Terminal Block

As described above, the terminal block only needs to include the terminal, the movable fastener that switches by movement between the first state of holding the conductive member connected with the terminal and the second state of releasing the conductive member, the storage unit that stores at least a part of the movable fastener in at least one of the first state and the second state, and the vent hole that is provided in the storage unit, and the specific configuration is not limited to the configuration shown above. In the following, modifications of the terminal block will be shown.

Figure 8:
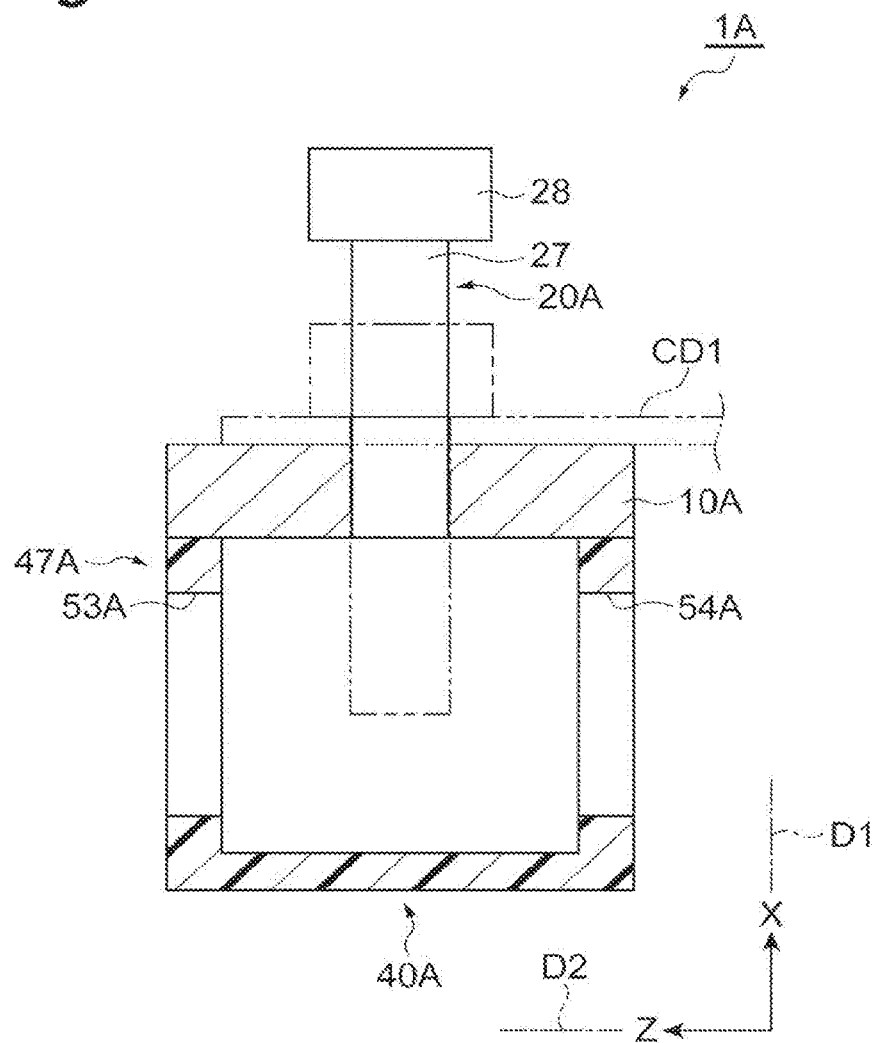
FIG. 8 is a schematic view showing a modification of the terminal block.

A terminal block 1A shown in FIG. 8 includes a terminal 10A, a movable fastener 20A and a case 40A. The terminal 10A is an element for connecting the conductive member CD1, and is composed of a conductive material such as metal, similarly to the terminal 10. As an example, the terminal 10A is a plate-like body crossing (for example, orthogonal to) the first direction D1.

The case 40A supports the terminal 10A. The case 40A includes a storage unit 47A that is arranged with the terminal 10A. The terminal 10A may be provided inside the storage unit 47A. The case 40A may be composed of an insulating material such as resin.

The movable fastener 20A is, for example, a bolt, and includes a thread part 27 and a head part 28. The thread part 27 is screwed in the terminal 10A, from the opposite side to the storage unit 47A. The movable fastener 20A may be composed of a conductive material such as metal. The movable fastener 20A switches between the above first state and second state, in a state in which the conductive member CD1 is positioned between the head part 28 and the terminal 10A. The movable fastener 20A is a means for switching by movement of the movable fastener 20A itself between the first state and the second state.

In a state in which there is a gap (a gap in the first direction D1) between at least one of the terminal 10A and the head part 28 and the conductive member CD1, the conductive member CD1 is not held connected with the terminal 10A. That is, the connection state of the conductive member CD1 with the terminal 10A is the above second state.

When the movable fastener 20A is rotated in the direction of tightening the thread part 27, the head part 28 comes close to the terminal 10A. When the head part 28 comes close to the terminal 10A until the conductive member CD1 comes into contact with both of the terminal 10A and the head part 28, the conductive member CD1 is held connected with the terminal 10A. That is, the connection state of the conductive member CD1 with the terminal 10A switches from the above second state to the above first state.

In the first state, when the movable fastener 20A is rotated in the direction of loosening the thread part 27, the head part 28 gets away from the terminal 10A, and the conductive member CD1 sandwiched between the head part 28 and the terminal 10A is released. That is, the connection state of the conductive member CD1 with the terminal 10A switches from the above first state to the above second state.

The storage unit 47A of the case 40A stores a part of the thread part 27 that pierces through the movable fastener 20A. The case 40A further includes vent holes 53A, 54A that are provided in the storage unit 47A. Similarly to the vent holes 53, 54, the vent holes 53A, 54A constitute a vent route that passes through the terminal block 1A along the second direction D2 crossing the movement route MR1.

Figure 9:
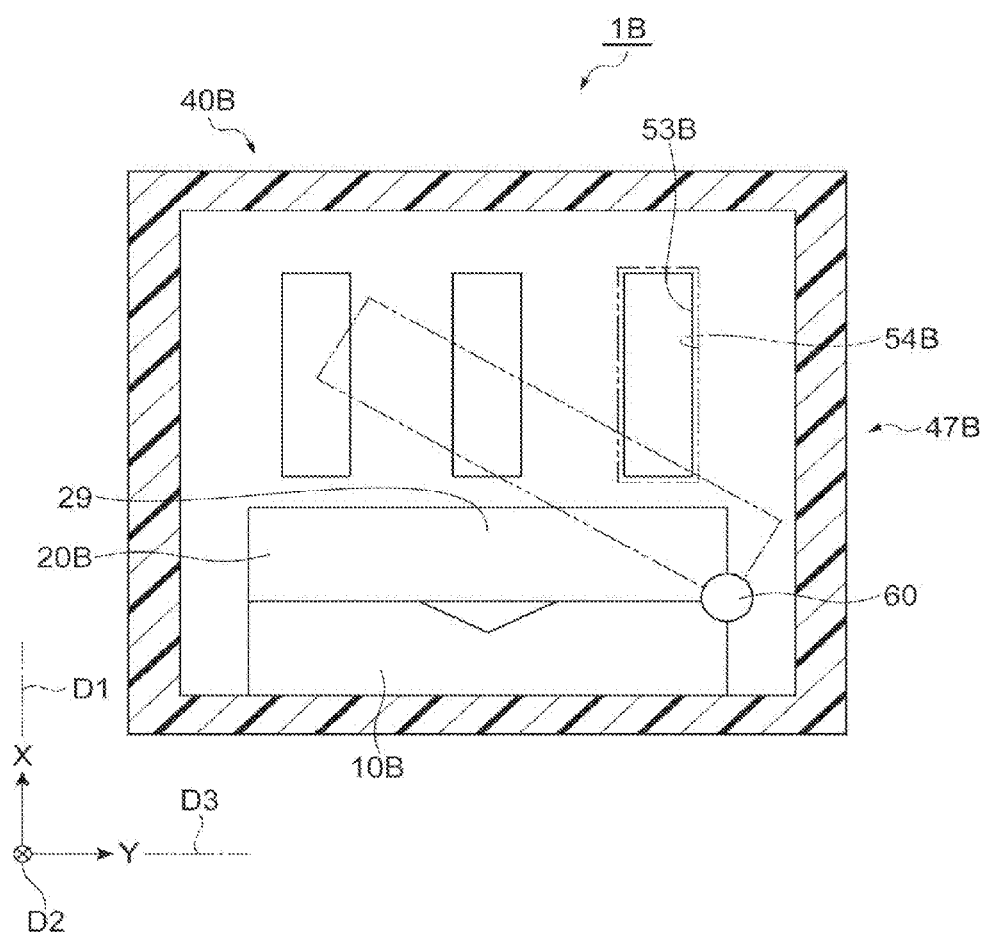
FIG. 9 is a schematic view showing another modification of the terminal block.

A terminal block 1B shown in FIG. 9 includes a terminal 10B, a movable fastener 20B and a case 40B. The terminal 10B is an element for connecting the conductive member CD1, and is composed of a conductive material such as metal, similarly to the terminal 10. As an example, the terminal 10B is a plate-like body crossing (for example, orthogonal to) the first direction D1.

The movable fastener 20B is laid on the terminal 10B. The movable fastener 20B may be composed of a conductive material such as metal. An edge part of the terminal 10B and an edge part of the movable fastener 20B are connected through a hinge 60. The central axis of the hinge 60 is along the second direction D2. The movable fastener 20B can rotate around the central axis of the hinge 60. With the above rotation, a part 29 of the movable fastener 20B that is distant from the hinge 60 moves in the first direction D1. The movable fastener 20B switches between the above first state and second state, in a state in which the conductive member CD1 is positioned between the part 29 and the terminal 10B. The hinge 60 is a means for switching by movement of the movable fastener 20B between the first state and the second state.

In a state in which there is a gap (a gap in the first direction D1) between at least one of the terminal 10B and the part 29 and the conductive member CD1, the conductive member CD1 is not held connected with the terminal 10B. That is, the connection state of the conductive member CD1 with the terminal 10B is the above second state.

When the movable fastener 20B is rotated in a direction in which the part 29 comes close to the terminal 10B and the part 29 comes close to the terminal 10B until the conductive member CD1 comes into contact with both of the terminal 10B and the part 29, the conductive member CD1 is held connected with the terminal JOB. That is, the connection state of the conductive member CD1 with the terminal 10B switches from the second state to the above first state.

In the first state, when the movable fastener 20B is rotated in a direction in which the part 29 gets away from the terminal 10B, the conductive member CD1 sandwiched between the part 29 and the terminal 10B is released. That is, the connection state of the conductive member CD1 with the terminal 10B switches from the above first state to the above second state.

The case 40B stores the terminal 10B and the movable fastener 20B. The case 40B may be composed of an insulating material such as resin. The case 40B includes a storage unit 47B. The storage unit 47B is arranged with the terminal 10B in the first direction D1, and stores at least a part of the movable fastener 20B. The terminal 10B may be provided inside the storage unit 47B.

The case 40B further includes vent holes 53B, 54B that are provided in the storage unit 47B. Similarly to the vent holes 53, 54, the vent holes 53B, 54B constitute a vent route that passes through the terminal block 1B along the second direction D2 crossing the movement route MR1. In FIG. 9, a wall part on which the vent hole 54B is formed is not illustrated, and therefore, the vent hole 54B is illustrated by the two-dot chain line. For preventing the overlap with the solid line illustrating the vent hole 53B, the vent hole 54B, for convenience, is illustrated in such a way as to be larger compared to the vent hole 53B, but this does not mean that the size of the vent hole 54B is larger compared to the size of the vent hole 53B.

2. Electric Power Conversion Apparatus

Subsequently, an electric power conversion apparatus including the above-described terminal block will be described, as an example of the application of the above-described terminal block to an electric machine.

(1) Configuration Example of Electric Power Conversion Apparatus

In the following, a specific configuration example of the electric power conversion apparatus will be shown with reference to FIGS. 10 to 12. For convenience of description, when the arrangement relation of constituent elements is shown, "upward/downward", "forward/backward" and "leftward/rightward" will be used below. The "upward/downward" means upward/downward when the electric power conversion apparatus is used in a predetermined installation state, and the "forward/backward" and "leftward/rightward" mean directions when the operation panel (described later) side is the forward side and the opposite side is the backward side. In illustration, the positive direction of the Z-axis is the upward direction, and the positive direction of the X-axis is the forward direction.

An electric power conversion apparatus 100 includes a main body 110 that includes the terminal block 1 and a circuit element 121. The main body 110 may include a plurality of circuit elements 121, and at least any circuit element 121 may be mounted on a circuit board 120. The circuit board 120 constitutes an electric power conversion circuit that includes the circuit element 121. Any of the plurality of circuit elements 121 may be disposed at a position away from the circuit board 120, and may be fixed to, for example, a base housing 140 described later or the like. In the main body 110, the terminal block 1 and the circuit element 121 are arranged along the second direction D2 crossing the above movement route MR1. For example, the terminal block 1 and the circuit board 120 are arranged along the second direction D2. Specific examples of the circuit element 121 include a transformer, a resistor, a capacitor, a relay and a magnet contactor.

The main body 110 may include a first part 111 and a second part 112. The first part 111 includes a fan 113 for generating air flow. The second part 112 is a part that is partitioned from the first part 111 in a direction crossing the above air flow. The terminal block 1 and at least one circuit element 121 may be provided in the second part 112. For example, the terminal block 1 and the circuit board 120 may be provided in the second part 112.

More specifically, the main body 110 includes a housing 130. For example, the housing 130 includes the base housing 140, a first cover 150, a second cover 160 and a third cover 170. The base housing 140 includes a first part 141 that is opened backward, and a second part 142 that is opened forward. The first part 141 and the second part 142 are partitioned by a dividing wall 143 (see FIG. 12). The first part 141 constitutes the first part 111 of the main body 110.

The fan 113 is provided on the housing 130. Any one of an intake port and an exhaust port is opened outside the housing 130, and the other is opened inside the housing 130. For example, the fan 113 is attached to an upper part of the first part 141, and forms the air flow along the upward/downward direction. At a lower part of the first part 141, vent holes 145 are formed. The vent holes 145 pass the air flow generated by the fan 113.

In the second part 142, the circuit board 120 and the terminal block 1 are installed. The terminal block 1 is installed at a lower part of the second part 142, in a state in which the first direction D1 is along the forward/backward direction, the second direction D2 is along the upward/downward direction and the third direction D3 is along the leftward/rightward direction. The circuit board 120 is installed along the dividing wall 143 and above the terminal block 1. Any of the plurality of circuit elements 121 may protrude to the inside of the first part 141 through the dividing wall 143. The circuit element 121 protruding to the inside of the first part 141 is cooled by the air flow from the fan 113.

The first cover 150 covers the terminal block 1 from the forward side. The first cover 150 includes an inlet hole 151, a vent hole 152 and an opening 153. The inlet hole 151 opens the inlet hole 51 of the terminal block 1, and allows for the inletting of the conductive member CD1 into the inlet hole 51. The vent hole 152 communicates with the vent holes 53, 54, and constitutes a vent route along the second direction D2. The opening 153 opens the opening 55 of the terminal block 1, and allows for the operation of the screw 30 from the forward side.

In the case where the terminal block 1 includes a plurality of inlet holes 51, the first cover 150 may include a plurality of inlet holes 151 that correspond to the plurality of inlet holes 51 respectively. The first cover 150 may include a plurality of vent holes 152 that are provided over a range in which a plurality of vent holes 53, 54 are provided (over a range including all vent holes 53, 54). In the case where the terminal block 1 includes a plurality of openings 55, the first cover 150 may include a plurality of openings 153 that correspond to the plurality of openings 55 respectively.

The terminal block 1 and the first cover 150 constitute an input/output port P1 for connecting the conductive member CD1 with the electric power conversion apparatus 100.

Figure 13:
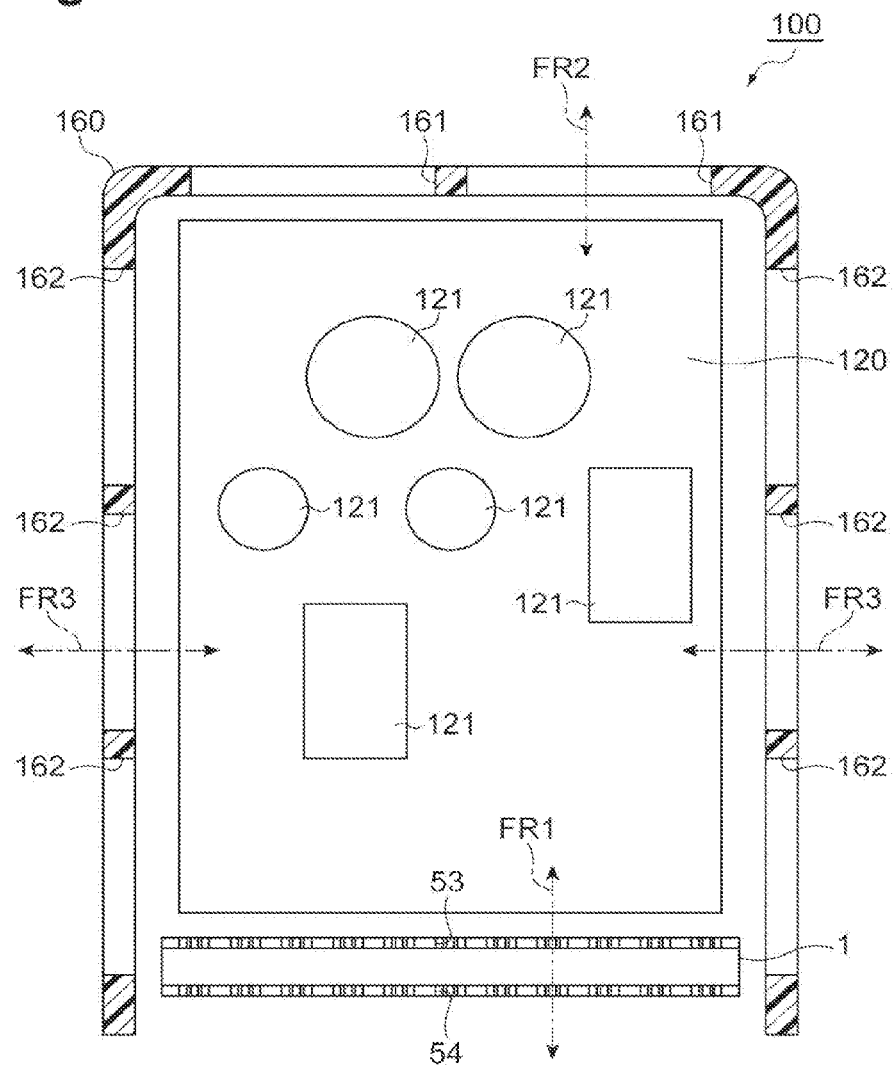
FIG. 13 is a schematic view showing a vent route in a second part of the electric power conversion apparatus.

The second cover 160 is fitted to the second part 142 from the forward side, and covers the circuit board 120 in a state in which the input/output port P1 is opened. A lower part of the second cover 160 is closed by the input/output port P1. In other words, the lower part of the second cover 160 is closed by the terminal block 1. Here, the closing does not always means closing the whole of an object region with no space, and includes closing most of the region while leaving a space. Although the lower part of the second cover 160 is closed by the terminal block 1, a vent route FR1 communicating between the inside and outside of the second cover 160 is constituted at the lower part of the second cover 160 as shown in FIG. 13, because the terminal block 1 includes the vent holes 53, 54.

The second cover 160 may include a vent hole 161 at an upper part. In this case, also at the upper part of the second cover 160, a vent route FR2 communicating between the inside and outside of the second cover 160 is constituted. Furthermore, the second cover 160 may include vent holes 162 at left and right lateral parts. In this case, also at the left and right lateral parts of the second cover 160, a vent route FR3 communicating between the inside and outside of the second cover 160 is constituted.

Figure 10:
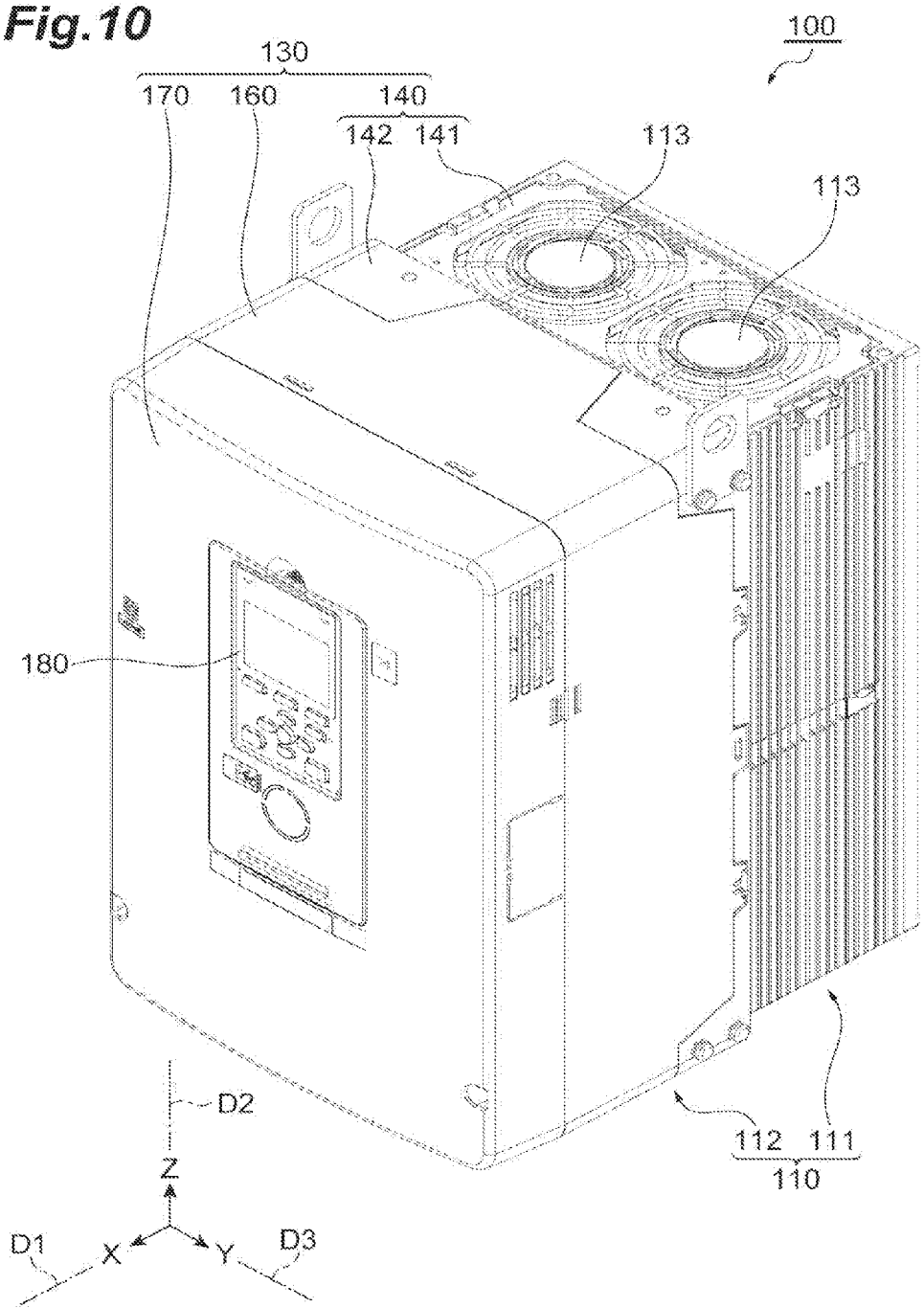
FIG. 10 is a perspective view of an electric power conversion apparatus.
Figure 11:
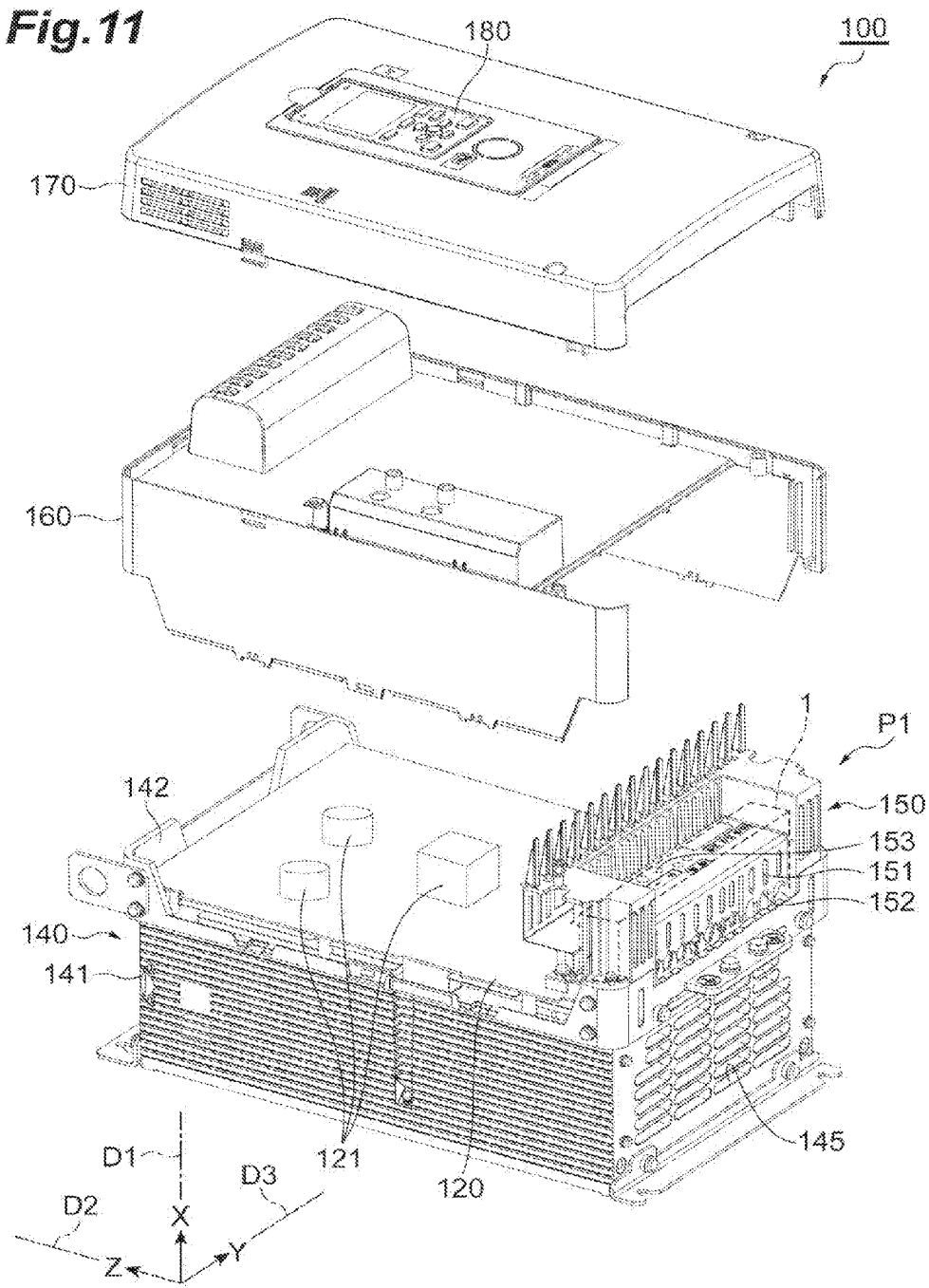
FIG. 11 is an exploded perspective view of the electric power conversion apparatus.
Figure 12:
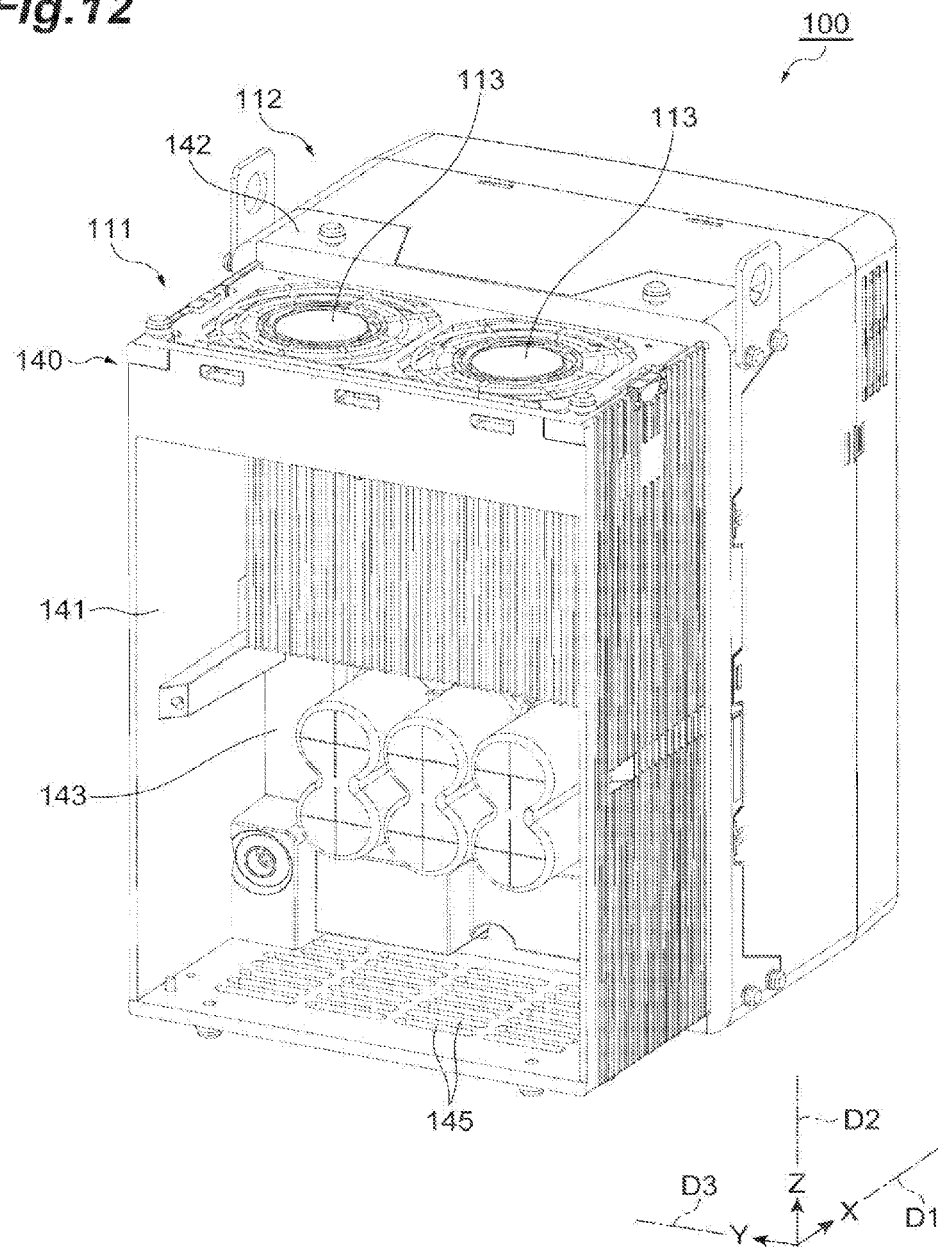
FIG. 12 is a perspective view of the back side of the electric power conversion apparatus.

Back to FIGS. 10 to 12, the third cover 170 is fitted to the second cover 160 from the forward side, and covers the second cover 160 and the input/output port P1. The second part 142, the first cover 150, the second cover 160 and the third cover 170 constitutes the second part 112 of the main body 110. The second part 112 does not need to include a fan in which any one of an intake port and an exhaust port is opened outside the housing 130 and the other is opened inside the housing 130 similarly to the fan 113 of the first part 111.

On the front surface of the third cover 170, an operator 180 is disposed. The operator 180 receives the input to the electric power conversion apparatus 100 by a user, and displays the internal information of the electric power conversion apparatus 100. The operator 180 may be detachable from the front surface of the third cover 170.

(2) Positional Relation of Terminal Block and Circuit Board

Figure 14:
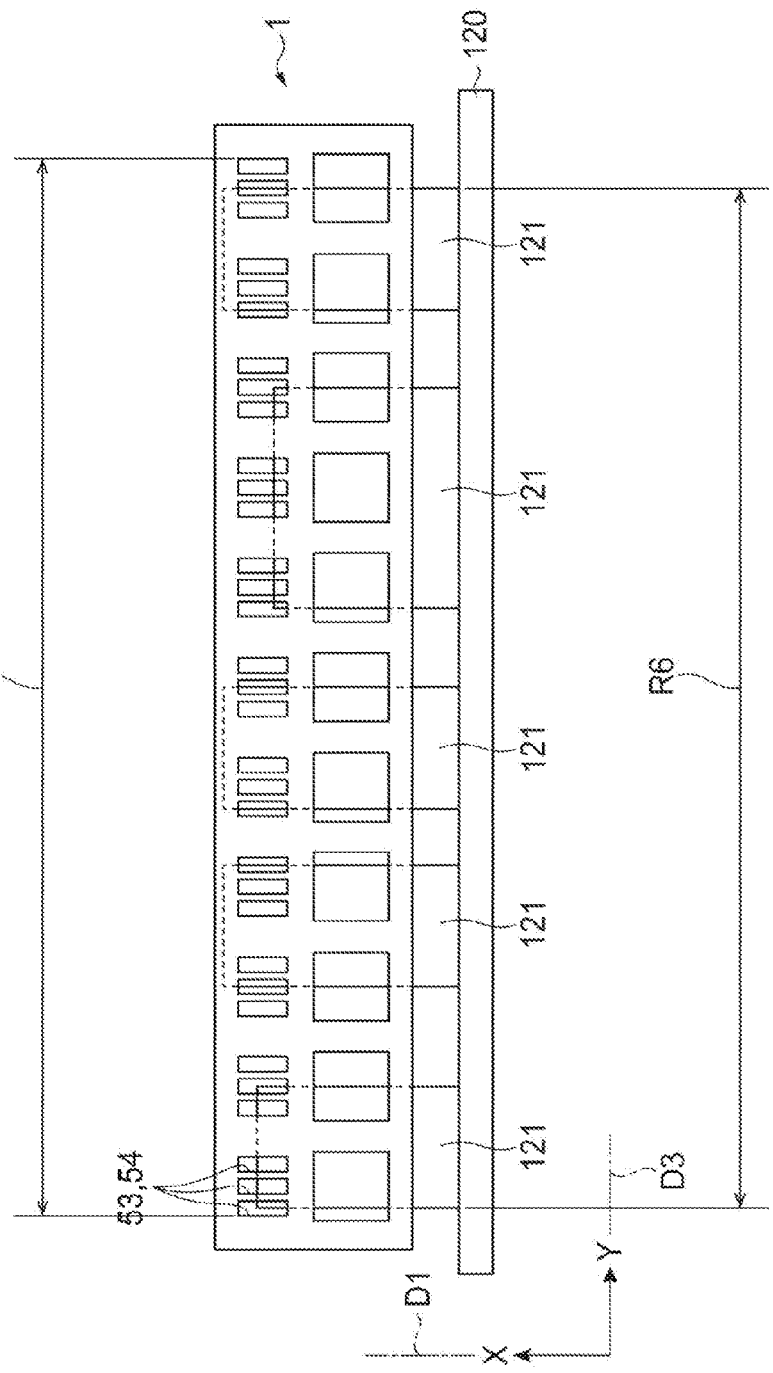
FIG. 14 is a schematic view showing a positional relation of the terminal block and circuit elements as viewed from below.

As exemplified above, the terminal block 1 and the circuit element 121 may be arranged along the second direction D2 (upward/downward direction) crossing the above movement route MR1. For example, the terminal block 1 and the circuit board 120 may be arranged along the second direction D2. As shown in FIG. 14, the vent holes 53, 54 of the terminal block 1 may be provided at positions that overlap with the circuit element 121, as viewed from one side (upward or downward side) in the second direction D2.

The main body 110 may include a plurality of circuit elements 121, and the plurality of circuit elements 121 may include at least two circuit elements 121 that are disposed in such a way as not to overlap with each other, as viewed from one side in the second direction D2. For example, the plurality of circuit elements 121 may include two transformers that are disposed in such a way as not to overlap with each other, as viewed from one side in the second direction D2.

As described above, the terminal block 1 may include a plurality of vent holes 53, 54, and the plurality of vent holes 53, 54 may be provided over a wider range compared to the plurality of circuit elements 121, in at least one direction crossing the second direction D2 (for example, in the third direction D3). That is, a region R4 including all of the plurality of vent holes 53 and a region R5 including all of the plurality of vent holes 54 may be in a wider range compared to a region R6 including all of the plurality of circuit elements 121, in at least one direction crossing the second direction D2 (for example, in the third direction D3). In the one direction, the whole range of the region R6 may be included in the region R4, or may be included in the region R5.

(3) Fixture

The electric power conversion apparatus 100 may further include a fixture 190 for fixing the main body 110 at an installation place. The fixture 190 may be any fixture if it is a fixture for fixing the main body 110 at the installation place. Specific examples of the fixture 190 include a bracket and a bolt for fixing it to the main body 110 and the installation place. The fixture 190 may be a bolt that is directly screwed in the main body 110, or may be a nut that is fitted to a male screw part provided in the main body 110.

The installation place is a place where the main body 110 is installed, in a facility using the electric power conversion apparatus 100, or the like. Specific examples of the installation place include the interior of a control board of a system (hereinafter, referred to as an "electric power conversion system") using the electric power conversion apparatus 100.

Specific examples of the electric power conversion system include a control system for a rotating electric machine including an electric motor or an electric generator.

Figure 15:
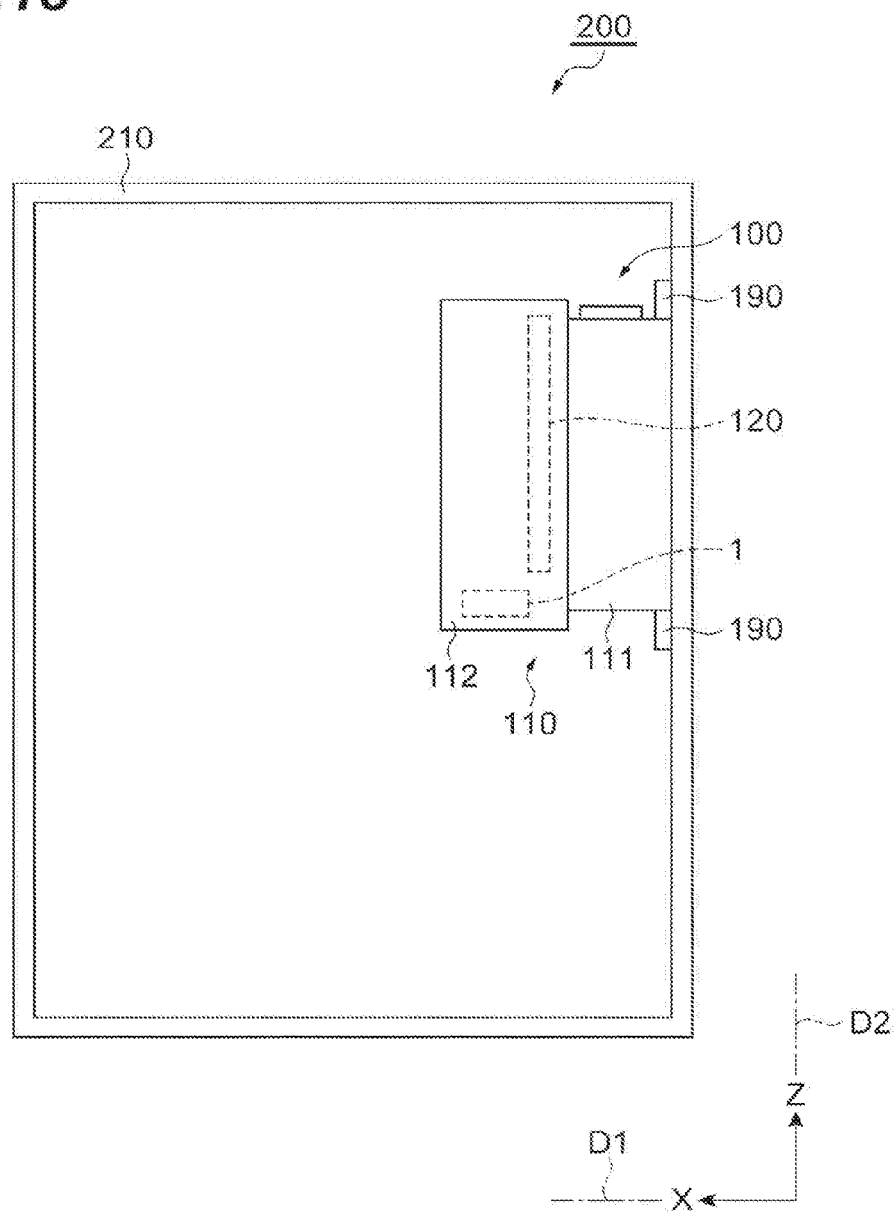
FIG. 15 is a schematic view showing a configuration example of an electric power conversion system.

FIG. 15 is a schematic view showing an example of an electric power conversion system 200. In the example of FIG. 15, the main body 110 of the electric power conversion apparatus 100 is installed in a system housing 210 of the electric power conversion system 200. The fixture 190 fixes the main body 110 to a lateral wall of the system housing 210. The electric power conversion apparatus 100 may be configured such that the terminal block 1 and the circuit element 121 are arranged in the vertical direction, in a state in which the fixture 190 fixes the main body 110 at the installation place, or may be configured such that the terminal block 1 and the circuit board 120 are arranged in the vertical direction. As an example, the electric power conversion apparatus 100 may be configured such that the terminal block 1 is positioned below the circuit element 121, in the state in which the fixture 190 fixes the main body 110 at the installation place, or may be configured such that the terminal block 1 is positioned below the circuit board 120.

Figure 16:
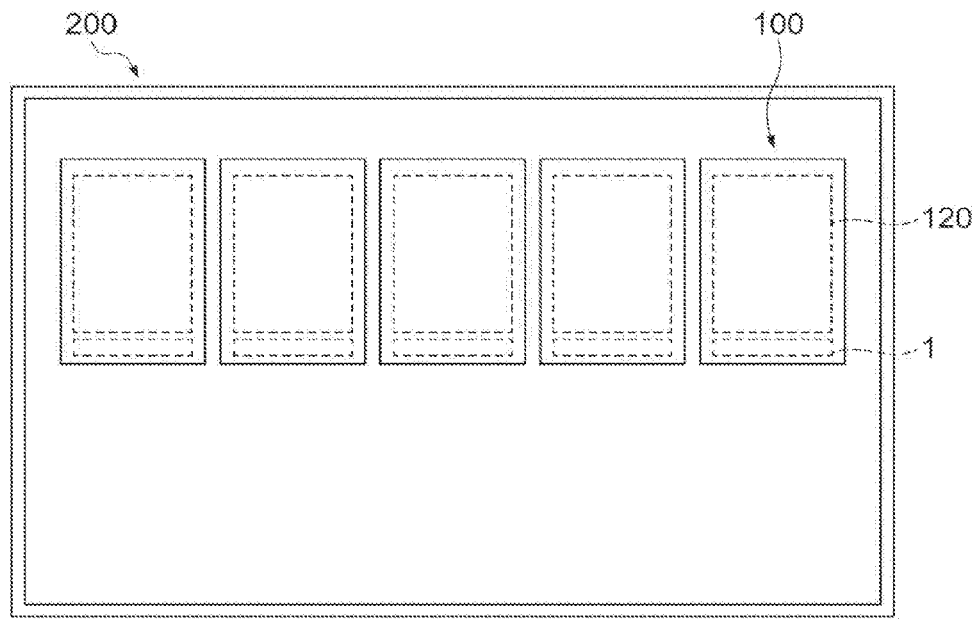
FIG. 16 is a schematic view showing another configuration example of the electric power conversion system.

As exemplified above, the electric power conversion system 200 may include the electric power conversion apparatus 100 that includes the circuit element 121 and the terminal block 1 arranged with the circuit element 121 along the vertical direction. As shown in FIG. 16, the electric power conversion system 200 may include a plurality of electric power conversion apparatuses 100, and the plurality of electric power conversion apparatuses 100 may be arranged along a direction crossing the vertical direction, such that the vent holes 53, 54 of the electric power conversion apparatuses 100 that are adjacent do not overlap with each other, as viewed from below. As an example, the plurality of electric power conversion apparatuses 100 may be disposed such that the main bodies 110 do not overlap with each other in the horizontal direction. For example, the plurality of electric power conversion apparatuses 100 may be arranged on a line along the horizontal direction.

3. Effect of Embodiment

As described above, the electric power conversion apparatus 100 comprises the terminal block 1 for connecting the conductive member CD1, and the terminal block 1 includes the terminal 10, the movable fastener 20 that switches by movement between the first state of holding the conductive member CD1 connected with the terminal 10 and the second state of releasing the conductive member CD1, the storage unit 47 that stores at least a part of the movable fastener 20 in at least one of the first state and the second state, and the vent holes 53, 54 that are provided in the storage unit 47.

According to the terminal block 1, since the movable fastener 20 is stored in the storage unit 47, the contact of foreign substances with the movable fastener 20 is inhibited. Since the vent holes 53, 54 are provided in the storage unit 47, it is possible to secure the vent route, even when a wall of the housing of the electric power conversion apparatus 100 is disposed close to the terminal block 1. Accordingly, by disposing the wall of the housing of the electric power conversion apparatus 100 close to the terminal block 1 while securing the vent route, it is possible to achieve the downsizing of the electric power conversion apparatus 100.

The electric power conversion apparatus 100 may further comprise the circuit element 121 for electric power conversion, the terminal block 1 and the circuit element 121 may be arranged along the second direction D2 crossing the movement route MR1 of the movable fastener 20, and the vent holes 53, 54 may be provided at positions that overlap with the circuit element 121, as viewed from one side in the second direction D2. In this case, the air flow passing through the vent holes 53, 54 easily runs through the periphery of the circuit element 121, and therefore, it is possible to promote the heat release of the circuit element 121 more surely.

The electric power conversion apparatus 100 may comprise a plurality of circuit elements 121, and the plurality of circuit elements 121 may include two circuit elements 121 that are disposed in such a way as not to overlap with each other, as viewed from one side in the second direction D2.

In this case, the air flow passing through the vent holes 53, 54 reaches one of the two circuit elements 121, without going through the other circuit element 121. Alternatively, the air flow passing through one of the two circuit elements 121 reaches the vent holes 53, 54, without going through the other circuit element 121. Therefore, whichever of the two circuit elements 121 is a heat source, the heat is exhausted without exerting a great influence on the other circuit element 121. Accordingly, it is possible to promote the heat release of the circuit element 121 more surely.

The terminal block 1 may include a plurality of vent holes 53, 54, and the plurality of vent holes 53, 54 may be provided over a wider range compared to the plurality of circuit elements 121, in at least one direction crossing the second direction D2. In this case, it is possible to generate the air flow to pass through the vent holes 53, 54, over a wider range compared to a range in which the plurality of circuit elements 121 are provided. Accordingly, it is possible to promote the heat release of the circuit element 121 more surely.

The electric power conversion apparatus 100 may comprise the main body 110 that includes the circuit element 121 and the terminal block 1, and the fixture 190 for fixing the main body 110 at the installation place, and the terminal block 1 and the circuit element 121 may be configured to be arranged in the vertical direction, in a state in which the fixture 190 fixes the main body 110 at the installation place. By the vent holes 53, 54 of the terminal block 1, the vertical vent route FR1 to pass through the circuit element 121 is constituted. Thereby, the natural convection along the vertical direction is easily generated, and therefore, it is possible to promote the heat release of the circuit element 121 more surely.

The terminal block 1 may be configured to be positioned below the circuit element 121, in the state in which the fixture 190 fixes the main body 110 at the installation place. In this case, it is possible to prevent the contact of foreign substances with the terminal 10 and the like in the terminal block 1, more surely.

The electric power conversion apparatus 100 may comprise the first part 111 that includes the fan 113 for generating air flow, and the second part 112 that is partitioned from the first part 111 in the direction crossing the air flow by the fan 113, and the terminal block 1 may be provided in the second part 112. In this case, by providing the terminal block 1 with a ventilation property in the second part 112, in which the cooling effect by the fan 113 is hard to be obtained, and thereby enhancing the heat release property in the second part 112, it is possible to promote the heat release of the circuit element 121 more surely.

For example, it is possible to dispose the circuit element 121 particularly requiring the cooling, in the first part 111, and cool this by the air flow from the fan 113, and to cool the other circuit elements 121 by the natural convection in the second part 112. Thus, by allowing the above other circuit elements 121 to be cooled in the second part 112, it is possible to concentrate the forced air cooling effect by the fan 113, on the above circuit element 121 particularly requiring the cooling. Accordingly, it is possible to perform a more efficient and more secure heat release.

The regions R1, R2 that the movable fastener 20 occupies in at least one of the first state and the second state and the region R3 where the vent holes 53, 54 are provided may overlap with each other in the direction along the movement route MR1 of the movable fastener 20. In this case, it is possible to use the part for storing the movable fastener 20, as the vent route, more surely. Therefore, it is possible to perform the downsizing of the terminal block 1 more surely.

The storage unit 47 may be configured such that at least a part of the movable fastener 20 is positioned outside the storage unit 47 in the second state and is positioned inside the storage unit 47 in the first state. In this case, the part of the movable fastener 20 that is positioned outside the storage unit 47 becomes smaller in the first state, compared to in the second state. Accordingly, the contact of foreign substances is inhibited more surely, in an actual use state in which the conductive member CD1 is connected with the terminal 10.

The movable fastener 20 may include the opening 26 that is positioned inside the storage unit 47 and communicates with the vent holes 53, 54 in the first state. In this case, it is possible to further enhance the ventilation property of the terminal block 1 in the first state, and therefore, it is possible to promote the heat release of the circuit element 121 more surely.

The terminal block 1 may further include the screw 30 in which at least a part is provided inside the storage unit 47 and that moves the movable fastener 20. In this case, the storage unit 47 concurrently serves as a storage unit for the screw 30, and therefore, a further downsizing of the terminal block 1 is possible in a type that moves the movable fastener 20 using the screw 30.

Thus, the embodiment has been described. The present invention is not always limited to the above-described embodiment, and various modifications are possible in a range without departing from the spirit. For example, the application object of the terminal block 1 is not always limited to electric power conversion apparatuses. The terminal block 1 can be applied to any electric machine that requires a port for connecting a conductive member and that incorporates a heat source therein. For example, the terminal block 1 can be applied also to breakers, shut-off switches, braking resistor units, fuse holders and the like.

Indeed, the novel devices and methods described herein may be embodied in a variety of other forms; furthermore, various omissions, substitutions and changes in the form of the devices and methods described herein may be made without departing from the spirit of the inventions. The accompanying claims and their equivalents are intended to cover such forms or modification as would fall within the scope and spirit of the inventions.

Certain aspects, advantages, and novel features of the embodiment have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

What is claimed is:

1. An electric power conversion apparatus comprising:
 a terminal block for connecting a conductive member, the terminal block including:
  a terminal;
  a movable fastener that switches by movement between a first state and a second state, the first state being a state of holding the conductive member connected with the terminal, the second state being a state of releasing the conductive member;
  a storage that accommodates at least a part of the movable fastener in at least one of the first state and the second state, the storage comprising an outer wall facing the movable fastener in a direction crossing a movable direction of the movable fastener in a state where the storage accommodates the part of the movable fastener; and
a vent hole that is provided in the outer wall of the storage.

2. The electric power conversion apparatus according to claim 1, further comprising a circuit element for electric power conversion,
wherein the vent hole is provided at a position that overlaps with the circuit element, as viewed from one side in a direction in which the terminal block and the circuit element are arranged.

3. The electric power conversion apparatus according to claim 2, comprising a plurality of circuit elements that include the circuit element,
wherein the plurality of the circuit elements include two circuit elements that are disposed in such a way as not to overlap with each other, as viewed from the one side in the direction in which the terminal block and the circuit element are arranged.

4. The electric power conversion apparatus according to claim 3,
wherein the terminal block includes a plurality of vent holes that include the vent hole, and
the plurality of the vent holes are provided over a wider range compared to the plurality of the circuit elements, in at least one direction crossing the direction in which the terminal block and the circuit element are arranged.

5. The electric power conversion apparatus according to claim 3, comprising:
a main body that includes the circuit element and the terminal block; and
a fixture for fixing the main body at an installation place,
wherein the terminal block and the circuit element are configured to be arranged in a vertical direction, in a state in which the fixture fixes the main body at the installation place.

6. The electric power conversion apparatus according to claim 5,
wherein the terminal block is configured to be positioned below the circuit element, in the state in which the fixture fixes the main body at the installation place.

7. The electric power conversion apparatus according to claim 2, comprising:
a main body that includes the circuit element and the terminal block; and
a fixture for fixing the main body at an installation place,
wherein the terminal block and the circuit element are configured to be arranged in a vertical direction, in a state in which the fixture fixes the main body at the installation place.

8. The electric power conversion apparatus according to claim 7,
wherein the terminal block is configured to be positioned below the circuit element, in the state in which the fixture fixes the main body at the installation place.

9. The electric power conversion apparatus according to claim 2, comprising:
a first part that includes a fan for generating air flow; and
a second part that is partitioned from the first part in a direction crossing the air flow,
wherein the terminal block is provided in the second part.

10. The electric power conversion apparatus according to claim 2,
wherein a region that the movable fastener occupies in at least one of the first state and the second state and a region where the vent hole is provided overlap with each other in a direction along a movement route of the movable fastener.

11. The electric power conversion apparatus according to claim 2,
wherein the storage is configured such that at least a part of the movable fastener is positioned outside the storage in the second state and is positioned inside the storage in the first state.

12. The electric power conversion apparatus according to claim 2,
wherein the terminal block further includes a screw that moves the movable fastener, at least a part of the screw being provided inside the storage.

13. The electric power conversion apparatus according to claim 1, comprising:
a first part that includes a fan for generating air flow; and
a second part that is partitioned from the first part in a direction crossing the air flow,
wherein the terminal block is provided in the second part.

14. The electric power conversion apparatus according to claim 1,
wherein a region that the movable fastener occupies in at least one of the first state and the second state and a region where the vent hole is provided overlap with each other in a direction along a movement route of the movable fastener.

15. The electric power conversion apparatus according to claim 1,
wherein the storage is configured such that at least a part of the movable fastener is positioned outside the storage in the second state and is positioned inside the storage in the first state.

16. The electric power conversion apparatus according to claim 15,
wherein the movable fastener includes an opening that is positioned inside the storage and communicates with the vent hole in the first state.

17. The electric power conversion apparatus according to claim 1,
wherein the terminal block further includes a screw that moves the movable fastener, at least a part of the screw being provided inside the storage.

18. The electric power conversion apparatus according to claim 1, further comprising:
a first part that includes a fan for generating air flow; and
a second part that is partitioned and offset from the first part in a direction perpendicular to the air flow,
wherein the terminal block is provided in the second part.

19. An electric power conversion system comprising:
an electric power conversion apparatus, the electric power conversion apparatus including:
an electric power conversion circuit; and
a terminal block connecting a conductive member, the terminal block being arranged with the electric power conversion circuit along a vertical direction,
the terminal block including:
a terminal;
a movable fastener that switches by movement between a first state and a second state, the first state being a state of holding the conductive member connected with the terminal, the second state being a state of releasing the conductive member;
a storage that stores accommodates at least a part of the movable fastener in at least one of the first state and the second state, the storage comprising an outer wall facing the movable fastener in a direction crossing a movable direction of the movable fastener in a state where the storage accommodates the part of the movable fastener: and a vent hole that is provided in the outer wall of the storage.

20. The electric power conversion system according to claim 19, further comprising a plurality of electric power conversion apparatuses that include the electric power conversion apparatus, wherein the plurality of the electric power conversion apparatuses are arranged along a direction crossing the vertical direction, such that the vent holes of the electric power conversion apparatuses that are adjacent do not overlap with each other, as viewed from below.

21. An electric power conversion apparatus comprising:

a terminal block for connecting a conductive member, the terminal block including:

a terminal;

a movable fastener that switches by movement between a first state and a second state, the first state being a state of holding the conductive member connected with the terminal, the second state being a state of releasing the conductive member;

a storage that stores at least a part of the movable fastener in at least one of the first state and the second state; and a vent hole that is provided in the storage, wherein the storage is configured such that at least a part of the movable fastener is positioned outside the storage in the second state and is positioned inside the storarage unit in the first state, and wherein a region that the movable fastener occupies in the first state and a region where the vent hole is provided overlap with each other as viewed from a side of the terminal block including the vent hole.

* * * * *